United States Patent
Maroney

(10) Patent No.: US 9,958,897 B1
(45) Date of Patent: May 1, 2018

(54) CONTROLLER BOARD HAVING EXPANDABLE MEMORY

(71) Applicant: Western Digital Technologies, Inc., Irvine, CA (US)

(72) Inventor: John E. Maroney, Irvine, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 758 days.

(21) Appl. No.: 14/311,224

(22) Filed: Jun. 20, 2014

(51) Int. Cl.
*H05K 1/14* (2006.01)
*G06F 1/16* (2006.01)

(52) U.S. Cl.
CPC ...................... *G06F 1/16* (2013.01)

(58) Field of Classification Search
CPC .. H05K 1/0218; H05K 1/0224; H05K 1/0298; H05K 1/141; G06F 1/189; G06F 1/184; G06F 1/185
See application file for complete search history.

(56) References Cited

U.S. PATENT DOCUMENTS

| | | | | |
|---|---|---|---|---|
| 5,051,099 A | * | 9/1991 | Pickles | H01R 12/721 439/108 |
| 5,821,614 A | * | 10/1998 | Hashimoto | H05K 1/148 235/492 |
| 6,365,839 B1 | * | 4/2002 | Robbins | H05K 1/0253 174/255 |
| 6,415,397 B1 | * | 7/2002 | Co | G01R 31/01 714/42 |
| 6,978,328 B1 | * | 12/2005 | Osaka | H05K 1/0228 365/52 |
| 7,701,705 B1 | | 4/2010 | Szeremeta | |
| 8,064,194 B2 | | 11/2011 | Szeremeta | |
| 8,113,873 B1 | | 2/2012 | Sarraf | |
| 8,133,426 B1 | | 3/2012 | Yurchenco et al. | |
| 8,358,395 B1 | | 1/2013 | Szeremeta | |
| 8,417,979 B2 | | 4/2013 | Maroney | |
| 8,462,460 B1 | | 6/2013 | Szeremeta et al. | |
| 8,498,088 B1 | | 7/2013 | Klein | |
| 8,547,658 B1 | | 10/2013 | Szeremeta | |
| 9,436,234 B1 | * | 9/2016 | Felton | H05K 7/1445 |
| 2003/0223284 A1 | * | 12/2003 | Isa | G11C 5/14 365/200 |
| 2004/0094328 A1 | * | 5/2004 | Fjelstad | H01R 9/0515 174/251 |
| 2004/0256638 A1 | * | 12/2004 | Perego | G06F 13/1684 257/200 |
| 2005/0139977 A1 | * | 6/2005 | Nishio | G06F 1/184 257/686 |

(Continued)

*Primary Examiner* — Hoa C Nguyen
*Assistant Examiner* — Christopher L Augustin
(74) *Attorney, Agent, or Firm* — Chang & Hale LLP

(57) ABSTRACT

Systems and methods are disclosed for routing electrical signals in a printed circuit board (PCB), wherein the PCB includes a conductive ground layer, a conductive power layer and a conductive signal layer. A first volatile memory module and a memory receptacle are mounted to the top surface of the PCB, wherein the memory receptacle electrically connects a second volatile memory to vias connected to the memory receptacle that extend through the ground, power and signal layers. The controller board includes one or more conductive traces disposed in the signal layer between the first and second vias, wherein signals may flow through the vias to the first volatile memory.

9 Claims, 6 Drawing Sheets

(56) References Cited

U.S. PATENT DOCUMENTS

| | | | |
|---|---|---|---|
| 2005/0270875 A1* | 12/2005 | Saeki | G06F 13/1684 365/222 |
| 2006/0232949 A1* | 10/2006 | Osaka | H05K 1/0236 361/788 |
| 2007/0128896 A1* | 6/2007 | Willis | H05K 1/116 439/79 |
| 2011/0119425 A1* | 5/2011 | Kollipara | G06F 13/1668 710/307 |
| 2012/0218703 A1* | 8/2012 | Cho | G06F 1/183 361/679.31 |
| 2012/0239856 A1 | 9/2012 | Cho | |
| 2014/0065881 A1* | 3/2014 | Vinay | H05K 1/141 439/620.2 |
| 2014/0102626 A1* | 4/2014 | Clayton | H05K 3/363 156/196 |

* cited by examiner

CONTROLLER BOARD HAVING EXPANDABLE MEMORY

BACKGROUND

Expandability of memory in computing systems can be desirable for various reasons. Controller board layout can be designed to accommodate memory expandability.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

DETAILED DESCRIPTION

Figure 1:
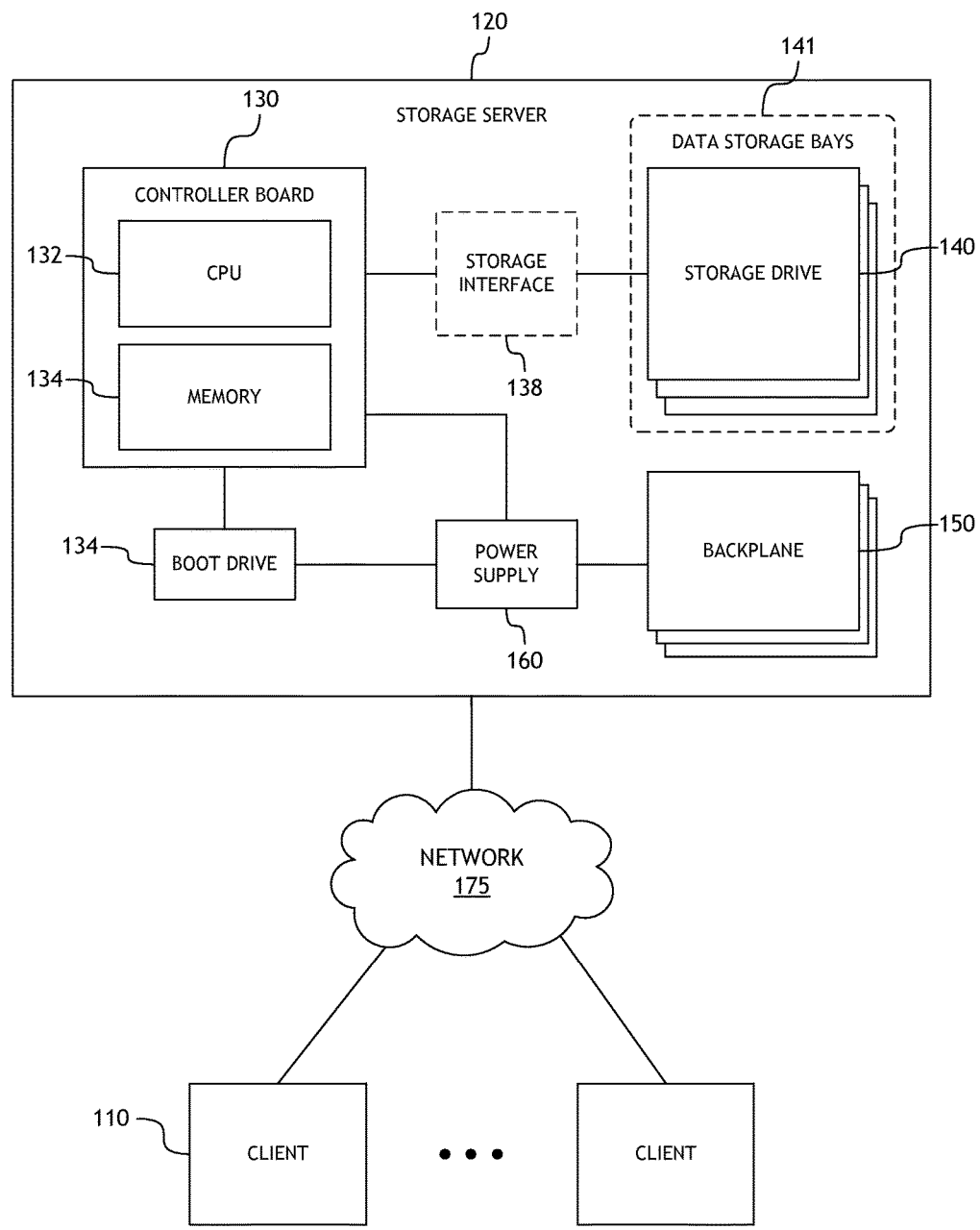
FIG. 1 is a diagram of a data storage system according to an embodiment.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

The headings provided herein are for convenience only and do not necessarily affect the scope or meaning of the claims. Disclosed herein are example configurations and embodiments relating to controller board layouts in data storage systems.

Overview

Computing systems, such as data storage servers, may include one or more controller boards, such as printed circuit boards (PCBs) having circuit chips and/or discrete components mounted or otherwise connected thereto, for providing control functionality for the system. Such boards may include one or more volatile memory modules, including, for example, dynamic random-access memory (DRAM). Volatile memory modules may be integrated into the controller board(s) or connected via expansion slot structures or other mechanism. An example volatile memory module is small outline dual in-line memory module (SO-DIMM) memory, which may provide a relatively small footprint (e.g., as compared to standard dual in-line memory modules (DIMM)).

In addition to integrated volatile memory, it may be desirable for a controller board to provide expandability for increasing the amount of system memory. For example, different users may require different amounts of volatile memory, and therefore the ability for such users to increase the board's memory may increase the value of the board. For various reasons, including cost associated with integrating volatile memory into the controller board, expandability may be provided through an expansion slot, or header structure. For example, a controller board may include a memory expansion receptacle configured to allow for a memory expansion card of some type (e.g., SO-DIMM or other type of DIMM memory) to be connected to conductive traces/leads integrated in the board. However, board layout considerations may make it desirable or necessary to place such expansion memory at least partially between the processor and other system memory module(s) or other system modules, such that routing of board traces around and/or through the expansion receptacle may be necessary to provide a communication pathway between the processor and such other modules. Furthermore, because of signal timing and/or other considerations, flow-through routing through expansion memory connectors/vias may be required with respect to at least some connections connecting the system processor (e.g., central processing unit (CPU)) to integrated system memory modules or other memory/system modules.

Certain SO-DIMM configurations may require a relatively high number of board layers (e.g., more than six layers) in order to accommodate flow-through routing of board traces. For example, it may be necessary for signals to be dropped down to lower signal layers to avoid interference with transmission lines connecting the expansion memory to other system modules. Utilization of PCBs having a smaller number of layers (e.g., six layers) can provide benefits with respect to cost and/or board profile considerations.

Certain embodiments disclosed herein provide a storage system comprising a CPU, a controller board, and multiple bays for receiving multiple storage devices. The controller board may include a first volatile memory, and a volatile memory slot which is configured to receive a second volatile memory. The first volatile memory may comprise a first type of volatile memory (e.g., SO-DIMM), and the second volatile memory comprises a second type of volatile memory comprising other than SO-DIMM memory (e.g., unbuffered DIMM (UDIMM)). Furthermore, the controller board may be a low-profile board (e.g., less than 10 layers) and may provide for flow-through connectivity between the CPU and the first volatile memory.

Certain embodiments provide for flow-through routing of conductive traces allowing for communication between the CPU and the first volatile memory substantially through vias connected to the volatile memory slot. The flow-through traces may be routed around a ground plane to provide desirable impedance control. Furthermore, in certain embodiments, the traces are routed using minimal layer switching. For example, no more than 2-layer transitions may be utilized in order to maintain desirable signal integrity at relevant transmission speeds.

Storage Server System

Aspects of embodiments are described herein in the context of data storage server systems. However, the embodiments herein are applicable to other types of computer systems including one or more controller boards/motherboards, such as, for example, desktop computers, laptop computers, tablets, smart phones, wearable computing devices, and the like.

FIG. 1 is a diagram of a data storage system according to an embodiment. As shown in FIG. 1, a storage server 100 according to one embodiment comprises a controller board 130, one or more backplane modules 150, and one or more storage drives or storage devices 140. As shown, the controller board 130 of the storage server 120 may comprise a central processing unit (CPU) 132. The CPU 132 may be coupled to a storage interface 138, such as a Serial ATA (SATA), Serial attached SCSI (SAS), Peripheral Component Interconnect (PCI), PCI Express (PCIe), or other type of storage interface. The storage interface 138 may be configured, according to one embodiment, as an extensible drive interface configured to implement a serial addressing scheme to access the storage drive(s) 140. The storage interface 138 may be configured to deliver power signals and storage protocol signals from the controller board, such as signals provided by an on-board bus-specific controller.

The controller board 130 further comprises system memory 134, which may provide main memory for the storage server 120. For example, the memory 134 may be configured to store data and instructions for executing programs/processes by the CPU. The memory 134 may further provide system cache, wherein the memory is used at least in part for relatively fast data storage access to relatively important and/or recently-used data and instructions. The memory may be any suitable size, such as 256 GB, 2 GB, 4 GB, 8 GB, or more. In certain embodiments, the memory 134 is volatile solid-state memory. As used in this application, "volatile solid-state memory," "volatile memory," "semiconductor memory," or variations thereof may refer to solid-state memory such as dynamic random access memory (DRAM) or static random access memory (SRAM). However, the systems and methods of this disclosure may also be useful in connection with other types of solid-state memory. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), MRAM, or other discrete NVM (non-volatile solid-state memory) chips.

The storage server 120 may include one or more power sources 160, which may be managed by a power controller (not shown). The architecture of FIG. 1 may be extended to different numbers of drives in different configurations. For example, the storage server 120 may include any number of rack unit storage bays 141 for receiving the storage drives 140, such as 2, 4, 8, or more bays. The storage drives 140 can have various types of storage media, such as HDD, SSD, or a hybrid of both.

The system of FIG. 1 further includes one or more client devices or systems 110 that may be configured to access the storage server 120 over a computer network 175, such as a local area network (LAN) or a wide area network (WAN), such as the Internet. The storage server 120 may provide data storage services to the clients 110.

Figure 2:
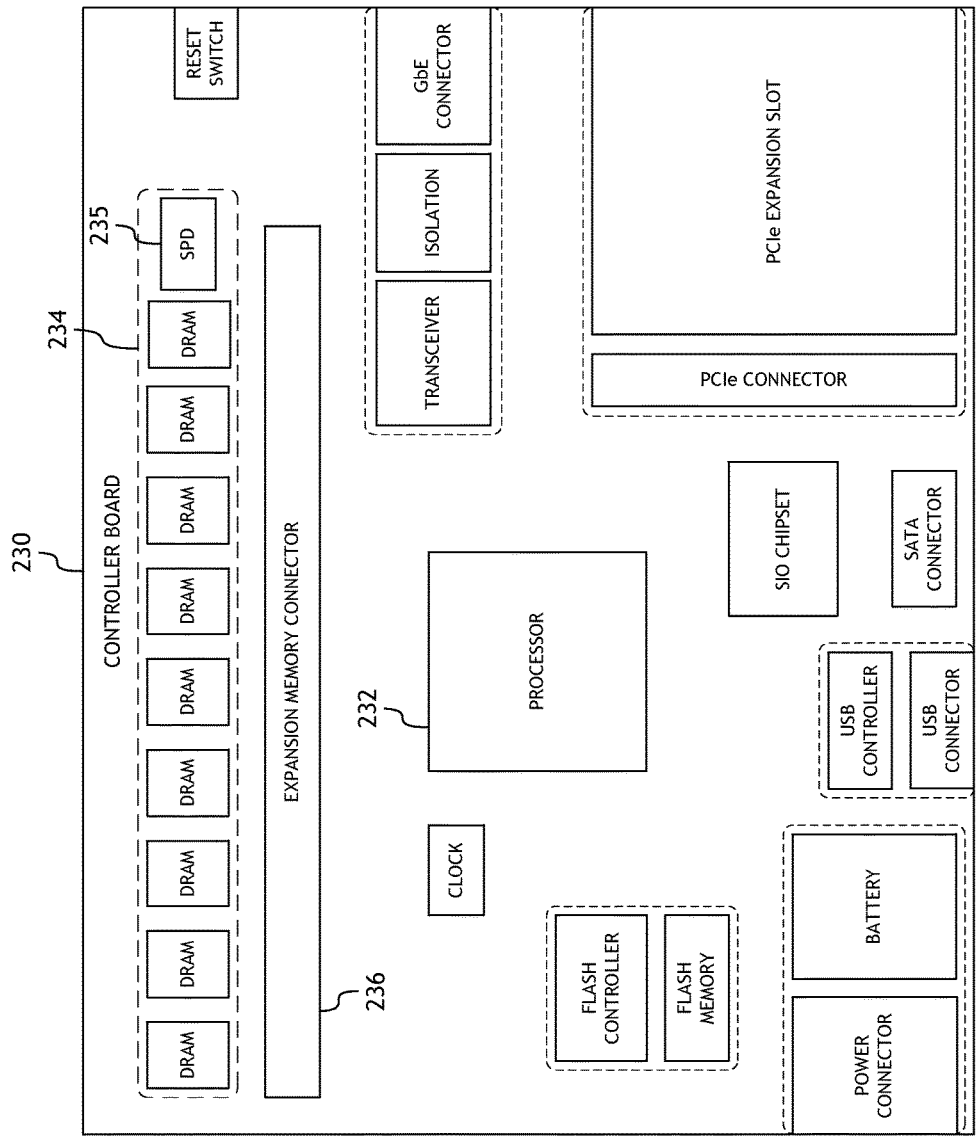
FIG. 2 is a diagram of a storage server controller board according to an embodiment.

FIG. 2 is a diagram of a storage server controller board 230 according to an embodiment. For example, the controller board 230 may represent an embodiment of the controller board 130 of FIG. 1. The controller board 230 includes a processor 232 and a memory module 234 of a first memory type, such as a volatile memory module using DDR3-compatible data communications. In certain embodiments, the memory module 234 includes a plurality of DRAM (e.g., DDR3) chips, wherein the processor 232 may communicate with the plurality of chips in parallel.

The controller board 230 may be configured to allow for expansion of volatile memory. As seen in FIG. 2, in addition to the volatile memory module 234, which may be integrated into the controller board 230, the controller board may include a connector slot configured to receive a removable separate volatile memory. For example, the expansion memory connector 236 may be configured for a 240-pin UDIMM memory card. The first volatile memory module 234, on the other hand, may comprise a SO-DIMM memory, such as a 204-pin SO-DIMM, in certain embodiments. In an embodiment, the memory module 234 comprises nine DRAM chips and provides error-correction (ECC) functionality. Alternatively, the memory module 234 may consist of only eight DRAM chips, wherein the memory module does not provide ECC functionality.

Because the expansion memory is connectable through the expansion slot 236, the design of FIG. 2 may allow for production of the controller board 230 without the expansion memory, wherein, a user may provide the expansion memory and thereby upgrade the storage system by adding the expansion memory into the volatile memory slot 236 at a later time.

The expansion memory connector may be configured to accommodate communication of the processor 232 with both the integrated memory 234 (or non-integrated SO-DIMM memory connected through a SO-DIMM connector slot) and the expansion memory 236 using a reduced number of layers, such as six layers. That is, in certain embodiments, the controller board 230 comprises six layers, thereby potentially providing reduced profile and/or cost for the controller board 230 compared to, for example, 10 or 12-layer boards. Certain embodiments disclosed herein provide for connections/traces to be routed from the processor 232 to the first volatile memory 234 through the expansion memory connector 236, as opposed to around the expansion memory connector.

The memory module 234 may include a serial presence detect (SPD) module 235, which may provide memory information to the basic input/output system (BIOS), including size, data width, speed, voltage, etc. The BIOS may use this information to configure the memory properly. The SPD may allow for features of the memory, such as density, manufacturer, timing, to fit the system memory profile, whatever type of memory is used. In an embodiment in which no SPD is present in connection with the memory module 234, the BIOS may assume specifications for the memory module.

In certain embodiments, the SPD 235 may provide information to the BIOS that allows for the memory module 234 to be used with ECC functionality. In certain embodiments, the SPD may be configured to accommodate both ECC and non-ECC functionality for either or both of memory module 234 and expansion memory 236. For example, if the expansion memory is a UDIMM memory, pinout configuration may be the same for either ECC or non-ECC functionality. Therefore, with the SPD configured for ECC functionality, the expansion memory may provide plug-and-play ECC memory.

The diagram of FIG. 2 includes various other controller board components that are identified, though not described in detail herein. However, one having ordinary skill in the art will appreciate the purpose and/or functionality of such blocks and/or components. Furthermore, a controller board designed according to principles disclosed herein may comprise more, fewer, and/or different types and/or quantities of components compared to the controller board 230 illustrated in FIG. 2.

Layout of Conductive Traces

Figure 3A:
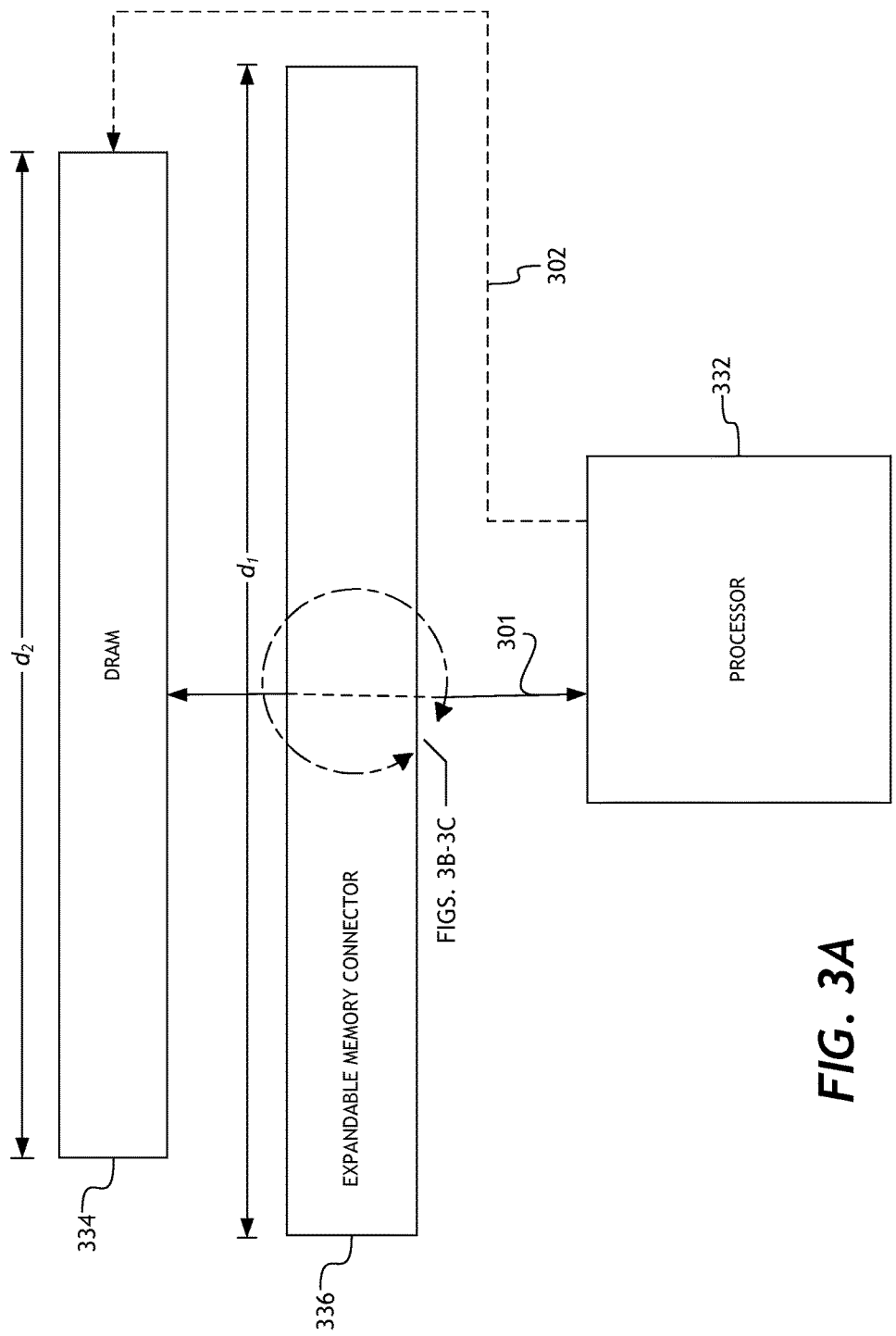
FIG. 3A is a diagram of a controller board layout according to an embodiment.

Certain embodiments disclosed herein provide for a controller board having conductive traces routed therein to provide flow-through communication between a first memory module (e.g., integrated DRAM) and a processor through a portion of the controller board that underlies an expansion memory connector/slot. FIG. 3A is a diagram of a controller board layout according to an embodiment. In certain embodiments, an expandable memory connector 336 is disposed at least partially between a system processor 332 and a system memory module 334. In order to communicate with the system memory 334, the processor 332 may be communicatively coupled with the memory module 334 through one or more conductive traces 302 that route around the expandable memory connector 336. However, the dimensions $d_1$ of the expandable memory connector 336 may require that any route-around traces follow a path 302 that is substantially longer than a more direct path 301 between the processor 332 and the system memory 334. As a result, depending on system clock speeds, the routing distance associated with routing around the expandable memory connector 336 may unacceptably affect the phase/timing of signals communicated between the processor 332 and the memory 334. Furthermore, such routing may introduce negative effects associated with cross-talk and/or impedance mismatch in certain configurations. Alternatively, routing of traces along a flow-through path 301 may advantageously allow for acceptable communication between the processor 332 and the memory module 334.

Flow-through routing may be impractical or undesirable for certain board configurations where the expandable memory connector 336 includes board connection pins that are too closely spaced to allow clearance for conductive traces to be routed between the pins. For example, a 204-pin SO-DIMM may have pins that are too close together to allow for flow-through routing between connecting vias. The dimension $d_2$ may represent a relative width of a SO-DIMM module to the width $d_1$ of, for example, a wider UDIMM module in certain embodiments. In certain embodiments, a SO-DIMM connector may be approximately half the width of the expandable memory connector 336. Furthermore, in certain embodiments, the associated circuit board on which the respective components are mounted may not include a sufficient number of layers to allow for traces to be dropped below vias used to connect the expandable memory connector 336 to the processor 332. For example, the respective PCB for the controller board configuration of FIG. 3A may include less than 10 layers, such as 6 layers.

As discussed above, the expandable memory connector may comprise a receptacle structure mounted on the PCB for receiving a memory card and connecting the memory card to vias that traverse one or more layers of the PCB. The connector 336 may comprise a housing containing pre-installed press-fit contacts. Each contact may comprise a tapered lead-in press fit tine. The connector may further comprise module support and/or extractor features designed to support and hold the memory card module in a mated position, as well as alignment post(s) to aid in board alignment during mating, and/or contact support frames. In certain embodiments, the board holes for the connector contact tines are plated through. Drilled hole sizes, plating types, and/or plating thickness may depend on application requirements.

Figure 3B:
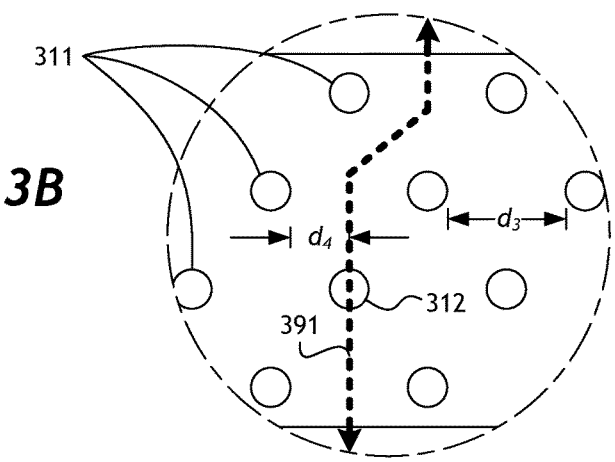
FIGS. 3B-3D illustrate embodiments of conductive traces in a controller board.
Figure 3C:
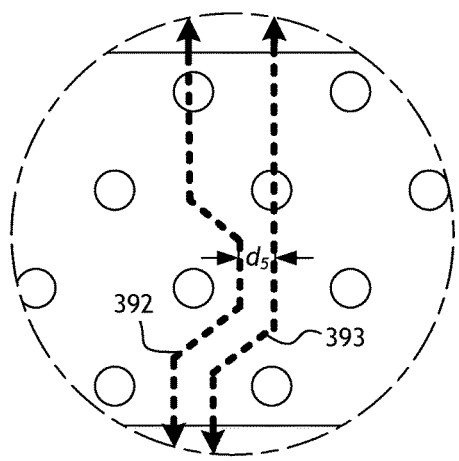
Figure 3D:
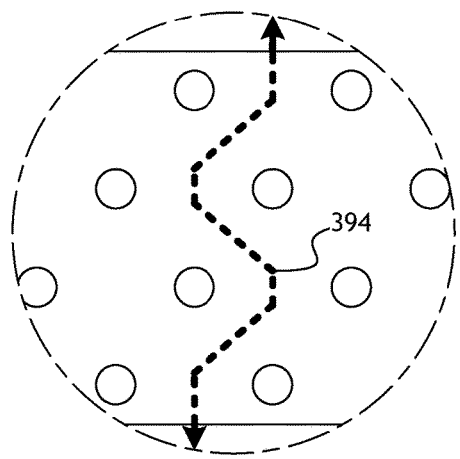

Unlike the 204-pin SO-DIMM connector, a 240-pin, 4-row UDIMM connector may include staggered pins that provide enough clearance between them in at least some portions to allow for flow-through trace routing between connection vias on layers that are used for communication between the connector 336 and the processor. FIGS. 3B-3D provide embodiments of trace routing configurations for routing through the expandable memory connector 336.

FIGS. 3B-3D illustrate embodiments of conductive traces in a controller board. As illustrated in the detailed diagrams of FIGS. 3B-3D, which provide cross-sectional views of vias or pins 311 associated with an expandable memory connector at a layer, or sub-layer, of a circuit board on which the connector is mounted. The various illustrated routing paths 391-394 represent embodiments of flow-through conductive transmission lines that may be used to traverse the expandable memory connector for communications between a board processor and a memory module disposed beyond the footprint of the expandable memory connector. As shown, the spacing of the pins and/or conductive vias connecting the pins to the various board layers may be staggered, thereby potentially providing increased spacing between pins/vias. In certain embodiments, a distance between pins/vias $d_3$ is approximately 14 mils or greater. For example, the distance $d_3$ may be approximately 25 mils, 50 mils, or up to 1 mm or greater.

In certain embodiments, the spacing $d_3$ between pins/vias at at least certain portions of the region underlying the expandable memory connector 336 is great enough to allow for the conductive path 391 to be routed between vias without substantially interfering with signal levels present on the pins/vias routed through, or otherwise affecting signal integrity. That is, the physical pitch of the pins is adequate to allow for flow-through routing. For example, in certain embodiments, it may be necessary or desirable for a flow-through trace to have a clearance $d_4$ from the pins/vias of approximately 5 mils or greater to substantially avoid interference therewith. In certain embodiments, the conductive trace 391 has a thickness of approximately 4-5 mils. Therefore, in order to route a single trace between pins without causing interference, it may be necessary for the distance $d_3$ between the pins to be approximately 14-15 mils, or greater. With respect to a SO-DIMM connector, such clearance may be unavailable due to the pinout configuration. For example, a SO-DIMM connector may include approximately 10 mils or less of space between pins, thereby substantially preventing flow-through routing.

In certain embodiments, as shown in FIG. 3C, a pair of traces (392, 393) may be routed between pins. In such embodiments, it may be necessary for the clearance between pins to be relatively greater. For example, the distance between pins may be approximately 25 mils, 50 mils, or up to 1 mm, or greater. In certain embodiments, the paired traces 392, 393 are a distance $d_5$ apart, such as 4 or 5 mils, or greater.

As shown in both FIGS. 3B and 3C, in certain embodiments, a trace may be routed through certain pins of the expandable memory connector and make contact with one or more pins (e.g., 312). For example, a shared signal line (e.g., data bus, etc.) may be routed to a contact of the expandable memory connector 336 and on to the volatile memory module 334. However, in certain embodiments, a trace may be routed through a region of the board underlying the expandable memory connector 336 without contacting any pins/vias associated therewith. FIG. 3D shows a trace 394 routed through the expandable memory connector 336 substantially without contacting any of the pins/vias associated with the connector. The trace 394, for example, may be used to route clock signals or chip select signals, which may be different for the two memory modules.

Although certain embodiments of routing paths/traces are illustrated in FIGS. 3B-3D, such embodiments are provided as examples only, and other paths may be used while still falling within the scope of the present disclosure. That is, any routing path between vias/pins of a controller board module may be used to provide flow-through routing as described herein.

Figure 4:
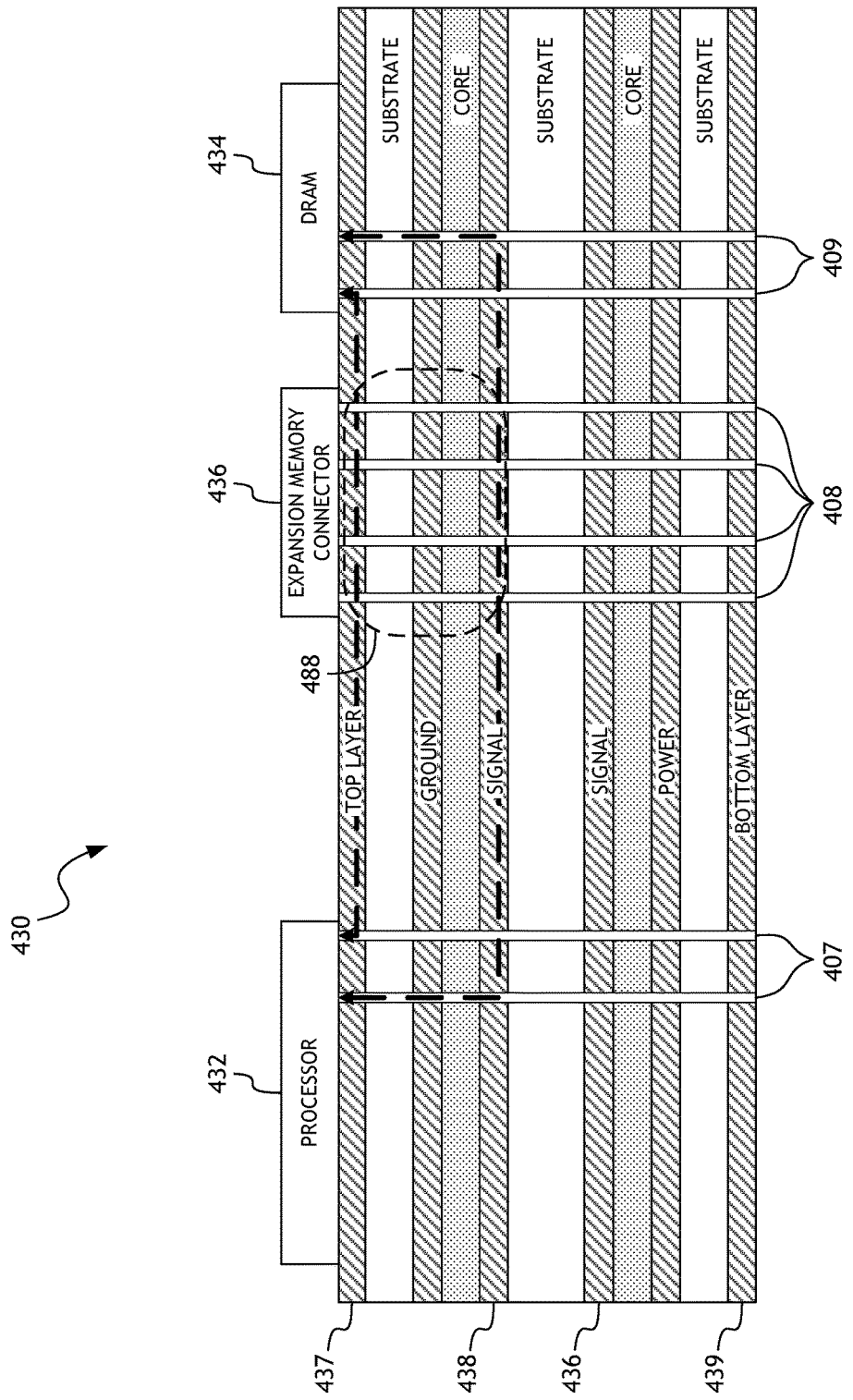
FIG. 4 is a cross-sectional view of a layered controller board according to an embodiment.

FIG. 4 is a cross-sectional view of a layered controller board 430 according to an embodiment. The board 430 is a six-layer board including six conductive layers comprising, for example, conductive copper (or other conductive medium) traces and/or planes, a plurality of dielectric substrate layers comprising elemental (e.g., silicon (Si)) or compound (e.g., gallium arsenide (GaAS)) semiconductor material, as well as one or more layers of core material separating conducting layers and providing electrical and/or thermal insulation and support for other layer structures. The core material may be made out of epoxy/fiber. The conductive layers may have a weight of between 0.5-4 ounces, which may present a thickness of approximately 1-6 mils. In an embodiment, one or more of the outer conductive layers (e.g., "top layer," "bottom layer") comprises single-ounce copper, while one or more of the internal signal, power and/or ground layers comprises 0.5-ounce copper.

Similarly to embodiments described above, the controller board 430 may be configured to provide flow-through trace routing between a processor 432 and memory module 434, which may comprise DRAM or other volatile memory. While certain embodiments are disclosed herein in the context of trace routing through an expansion memory connector to a volatile memory module, the principles discussed may be applicable in other applications, such as for routing through other types of connectors and/or to types of modules other than volatile memory modules.

The board 430 may provide a relatively low-profile board solution, (e.g., "very low profile" (VLP)). That is, flow-through routing may be achieved in the controller board 430 without the need for 10, 12, or more layers. In certain embodiments, the processor 432 may communicate with the memory module 434 over a differential pair of signal lines (e.g., 437, 438) disposed about a ground layer, which may provide a stable reference for the signal layers and/or impedance matching for the transmission lines. Additionally, or alternatively, the processor 432 may communicate with the memory module 434 over signal lines (e.g., 436, 439) disposed about a power layer, which may serve as an electrical reference for the signal lines. However, the ground layer may provide a more stable reference than the power layer, and therefore critical signals may advantageously be transmitted on the layers tied to the ground layer reference.

The traces over which the processor 432 may communicate with the memory module 434 over may be routed over signal lines that are referenced to the ground plane, as illustrated. Such ground reference may advantageously provide desirable impedance control for the conductive traces, which may thereby help maintain signal integrity. Furthermore, the traces may be configured such that no more than 2-layer switching is utilized, which may provide a relative reduction in signal reflections, thereby allowing for adequate signal integrity to be maintained at relevant signal transmission speeds.

Signals transmitted between the processor 432 and the memory module 434 may travel from the processor to conductive board layers via pin-to-via connections. For example, the vias 407 may be connected to connection pins of the processor and may extend substantially perpendicularly from a surface of the board 430 through one or more layers of the board 430. In an embodiment, one or more vias of the board may extend to a bottom solder layer 439 of the board 430. The signals may be received/transmitted by the memory module 434 over pin/via connections 409. The signals may be routed on traces that traverse vias connected to pins of the expansion memory connector 436 in a manner as described herein, wherein signal integrity is maintained for flow-through communication between the memory module 434 and the processor 432. The outlined region 488, for example, may include traces routed between conductive vias, as described above.

Figure 5:
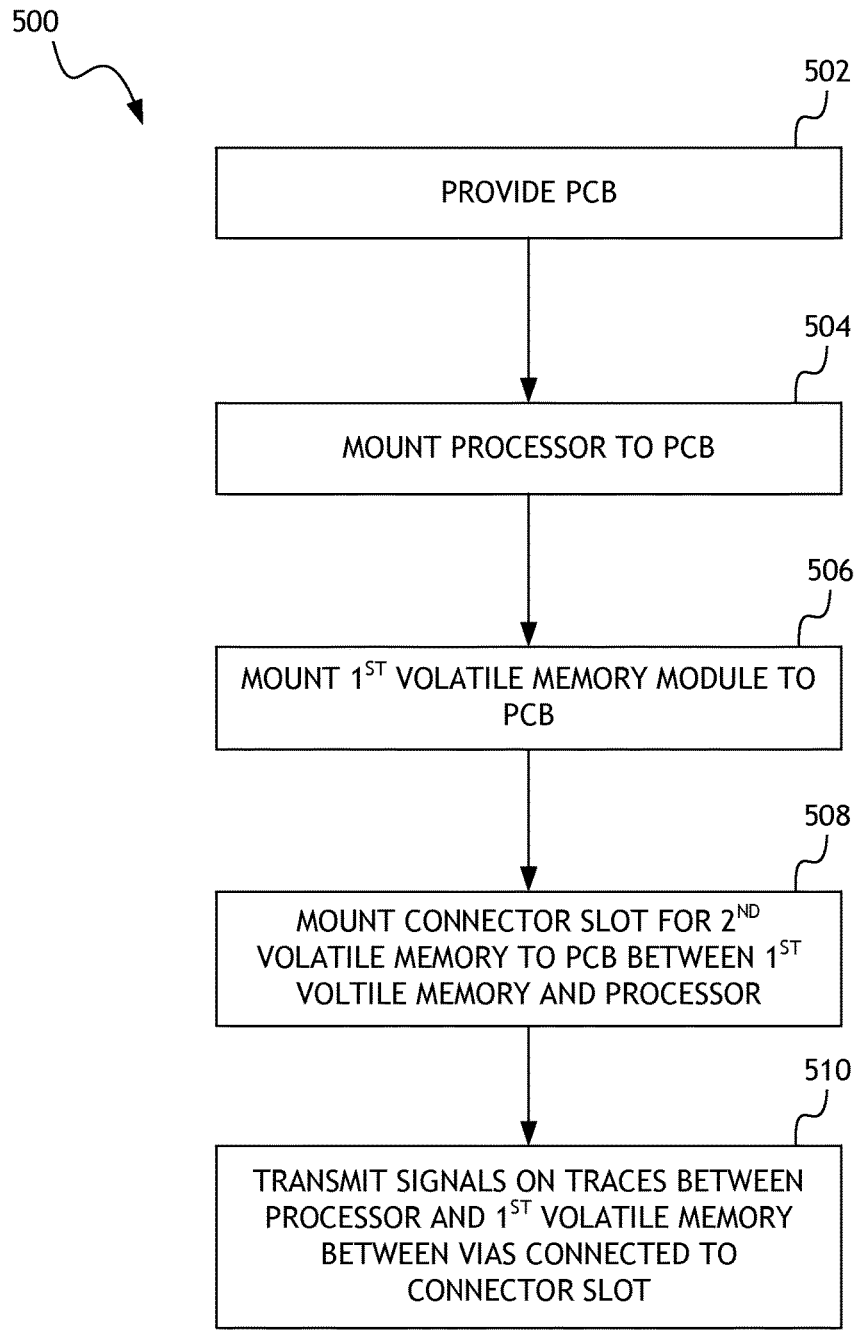
FIG. 5 is a flow diagram illustrating a process for manufacturing a controller board according to an embodiment.

FIG. 5 is a flow diagram illustrating a process 500 for manufacturing a controller board according to an embodiment. The process 500 includes providing a printed circuit board (PCB) at block 502, which may be used for a controller board for a computing system, such as a storage server system. At block 504, the process 500 may include mounting a processor module to the controller board. The first memory module may be integrated with the controller board or may be connected to the controller board via a connector slot, such as a SO-DIMM connector slot.

The process further includes mounting a first volatile memory module to the controller board at block 506 and mounting an expansion memory connector slot for receiving a second volatile memory module to the controller board at least partially between the processor and the first volatile memory at block 508. In certain embodiments, the expansion memory connector slot is a UDIMM connector, which may have a relatively wide footprint with respect to the first volatile memory module. The second volatile memory module may therefore be a UDIMM expansion card, or the like. At block 510, the process 500 includes transmitting signals on conductive traces of the controller board that route between the processor and the first volatile memory module between vias connected to the expansion memory connector slot. For example, such transmitting may be for testing purposes to determine adequate functionality of the controller board vis-à-vis the first and/or second volatile memory modules. In certain embodiments, after manufacturing, the controller board may be provided to end users without the second volatile memory connected to the board, thereby providing upgradability of the controller board.

Additional Embodiments

Those skilled in the art will appreciate that in some embodiments, other types of flow-through trace routing systems can be implemented while remaining within the scope of the present disclosure. In addition, the actual steps taken in the processes discussed herein may differ from those described or shown in the figures. Depending on the embodiment, certain of the steps described above may be removed, others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure.

Accordingly, the scope of the present disclosure is intended to be defined only by reference to the appended claims.

What is claimed is:

1. A controller board comprising:
    a printed circuit board (PCB) comprising:
        a top surface;
        a ground layer;
        a power layer; and
        a first signal layer;
    a processor mounted to the top surface of the PCB;
    a first volatile memory module directly mounted to the top surface of the PCB;
    a memory receptacle mounted to the top surface of the PCB between the processor and the first volatile memory module, the memory receptacle configured to removably receive a second volatile memory module and electrically connect the second volatile memory module to first and second staggered rows of vias connected to the memory receptacle that extend substantially perpendicularly to the top surface through the ground layer, the power layer, and the first signal layer; and
    one or more conductive traces communicatively coupling the processor to the first volatile memory module;
    wherein the one or more conductive traces are disposed in the first signal layer, and are routed between adjacent vias of the first row of vias and adjacent vias of the second row of vias, and traverse the memory receptacle in a dimension perpendicular to a longitudinal dimension of the memory receptacle.

2. The controller board of claim 1, wherein the first volatile memory module is electrically connected to the PCB via a first plurality of pins and the memory receptacle is electrically connected to the PCB via a second plurality of pins, wherein a first spacing between the second plurality of pins is greater than a second spacing between the first plurality of pins, thereby allowing for the one or more conductive traces to be routed between the first spacing without contacting the second plurality of pins.

3. The controller board of claim 1, wherein the one or more conductive traces comprise first and second conductive traces routed between the adjacent vias of the first row of vias and the adjacent vias of the second row of vias.

4. The controller board of claim 1, wherein the first volatile memory module is a SO-DIMM memory module and the second volatile memory module is a UDIMM memory module.

5. The controller board of claim 1, wherein the PCB consists of six conductive layers, wherein the one or more conductive traces lie in a top layer of the six conductive layers.

6. The controller board of claim 1, wherein the memory receptacle is further configured to electrically connect the second volatile memory module to a third row of vias that is longitudinally aligned with the first row of vias and staggered with respect to the second row of vias, wherein the one or more conductive traces electrically contact a via of the third row of vias.

7. The controller board of claim 1, wherein the PCB further comprises a second signal layer disposed between the ground layer and the power layer, wherein the controller board further comprises one or more traces disposed in the second signal layer and lying between vias connected to the memory receptacle.

8. The controller board of claim 7, wherein the processor is configured to communicate data, control and addressing signals to the first volatile memory module and the second volatile memory module using only the first signal layer and the second signal layer.

9. The controller board of claim 1, wherein the first volatile memory module comprises a serial presence detect (SPD) module that is configurable to accommodate error correction code (ECC) functionality and non-ECC functionality of the first volatile memory module.

* * * * *